United States Patent
Yoshida et al.

(10) Patent No.: US 10,818,482 B2
(45) Date of Patent: Oct. 27, 2020

(54) METHODS FOR STABILITY MONITORING AND IMPROVEMENTS TO PLASMA SOURCES FOR PLASMA PROCESSING

(71) Applicant: Tokyo Electron Limited, Tokyo (JP)

(72) Inventors: Yusuke Yoshida, Albany, NY (US); Jason Marion, Malta, NY (US); Sergey Voronin, Albany, NY (US); Alok Ranjan, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/576,327

(22) Filed: Sep. 19, 2019

(65) Prior Publication Data

US 2020/0105510 A1    Apr. 2, 2020

Related U.S. Application Data

(60) Provisional application No. 62/741,406, filed on Oct. 4, 2018, provisional application No. 62/737,242, filed on Sep. 27, 2018.

(51) Int. Cl.
*H01J 37/32*     (2006.01)
*H01L 21/66*     (2006.01)
*H01L 21/3065*   (2006.01)

(52) U.S. Cl.
CPC .. *H01J 37/32972* (2013.01); *H01J 37/32926* (2013.01); *H01L 22/20* (2013.01);
(Continued)

(58) Field of Classification Search
CPC .......... H01J 37/32972; H01J 37/32926; H01J 2237/332; H01J 2237/24514; H01J 2237/2441; H01J 2237/24495; H01J 2237/24592; H01J 2237/334; H01L 22/20; H01L 21/3065

See application file for complete search history.

(56) References Cited

U.S. PATENT DOCUMENTS 6,633,391 B1 *  10/2003  Oluseyi ................. G01N 21/71
                                                   356/630
6,762,849 B1 *  7/2004  Rulkens ............. G01B 11/0625
                                                   356/503

(Continued)

*Primary Examiner* — Anita K Alanko
(74) *Attorney, Agent, or Firm* — Rothwell, Figg, Ernst & Manbeck, P.C.

(57) ABSTRACT

Methods are disclosed to detect plasma light emissions during plasma processing, to analyze light intensity data associated with the plasma source, and to adjust operating parameters for the plasma source and/or the process chamber based upon light intensity distributions associated with the plasma processing. The light intensity distributions for the plasma sources and related analysis can be conducted across multiple processing tools. For some embodiments, plasma discharge stability and/or chamber-to-chamber matching information is determined based upon light intensity data, and the operation of the processing tools are adjusted or controlled based upon stability and/or matching determinations. The disclosed embodiments thereby provide simple, low-cost solutions to assess and improve plasma sources and discharge stability for plasma processing tools such as plasma etch and deposition tools.

20 Claims, 6 Drawing Sheets

(52) U.S. Cl.
CPC .......... *H01J 2237/2441* (2013.01); *H01J 2237/24495* (2013.01); *H01J 2237/24514* (2013.01); *H01J 2237/24592* (2013.01); *H01J 2237/332* (2013.01); *H01J 2237/334* (2013.01); *H01L 21/3065* (2013.01)

(56) References Cited

U.S. PATENT DOCUMENTS

| | | | | |
|---|---|---|---|---|
| 7,395,779 | B2 * | 7/2008 | Ishii | B01J 19/088 |
| | | | | 118/723 MW |
| 8,460,945 | B2 * | 6/2013 | O'Meara | H01J 37/32935 |
| | | | | 438/7 |
| 10,651,017 | B2 * | 5/2020 | Voronin | H01J 37/32715 |
| 2005/0070104 | A1 * | 3/2005 | O'Meara | H01L 21/67253 |
| | | | | 438/689 |
| 2008/0138993 | A1 * | 6/2008 | Hiroshima | H01J 37/32935 |
| | | | | 438/714 |
| 2018/0298488 | A1 * | 10/2018 | Sakata | C23C 14/52 |
| 2020/0051787 | A1 * | 2/2020 | Shinagawa | H01J 37/32449 |
| 2020/0176261 | A1 * | 6/2020 | Takeda | H05H 1/46 |

\* cited by examiner

METHODS FOR STABILITY MONITORING AND IMPROVEMENTS TO PLASMA SOURCES FOR PLASMA PROCESSING

RELATED APPLICATIONS

This application claims priority to the following provisional applications: U.S. Provisional Patent Application Ser. No. 62/737,242, filed Sep. 27, 2018, and entitled "METHODS FOR STABILITY MONITORING AND IMPROVEMENTS TO PLASMA SOURCES FOR PLASMA PROCESSING" and U.S. Provisional Patent Application Ser. No. 62/741,406, filed Oct. 4, 2018, and entitled "METHODS FOR STABILITY MONITORING AND IMPROVEMENTS TO PLASMA SOURCES FOR PLASMA PROCESSING", which are hereby incorporated by reference in their entirety.

BACKGROUND

The present disclosure relates to methods for the manufacture of microelectronic workpieces including the formation of patterned structures on microelectronic workpieces.

Device formation within microelectronic workpieces typically involves a series of manufacturing techniques related to the formation, patterning, and removal of a number of layers of material on a substrate. For the manufacture of some microelectronic workpieces, plasma processing tools are utilized having process chambers. Certain plasma processing tools utilize an upper source plasma generation configuration.

FIG. 1A (Prior Art) is a diagram of an example embodiment for a plasma processing tool 100 including a process chamber 112 and a plasma source 102 having a top plate 104 positioned within the process chamber 112. A microelectronic workpiece 108, such as a semiconductor wafer, is positioned on a holder 110, such as a wafer station or an electrostatic chuck. The holder 110 includes a lower electrode. For plasma processing of the microelectronic workpiece 108, such as plasma etch or deposition processing, process plasma 106 is ignited and maintained within the process chamber 112 for the plasma processing tool 100.

FIG. 1B (Prior Art) is a diagram of an example embodiment for a top plate 104 for the plasma source 102. The surface 156 for the top plate 104 is exposed to the interior of the process chamber 112, as shown in FIG. 1A (Prior Art). The surface 156 for top plate 104 has dimples 154 associated with the generation of plasma within the process chamber 112. For the example embodiment depicted in FIG. 1B, there are seven dimples 154 positioned symmetrically around the surface 156 of a circular body 152 for the top plate 104.

Plasma processing tools, such as plasma processing tool 100 in FIG. 1A (Prior Art), can experience chamber-to-chamber variation due to sensitivities related to hardware (HW) components and assembly, due to marginal plasma stabilities, and/or due to other causes. Chamber-to-chamber HW variations, for example, can be due to stacking tolerances of the overall assembled HW components. Chamber-to-chamber HW variations can also be due to the machining tolerances inherent in any production of individual HW components (e.g., no two HW components are exactly the same). Other HW related variations can also lead to chamber-to-chamber HW variations. With respect to plasma stability marginalities, the combination of the chamber-to-chamber HW variations and non-optimized process conditions can lead to non-repeatable plasma characteristics. For example, varying plasma densities across the upper electrode or top plate of a plasma source in certain systems can lead to non-repeatable plasma stability characteristics.

Detection of such plasma density variation across the plasma source typically requires a viewport to observe visually the plasma generation or a multi-zone optical emission spectrometer to collect the fluorescence given off by the plasma. Both of these solutions, however, involve added complexity and inherent complications to the manufacturing of plasma etch and deposition tools. This added manufacturing complexity is undesirable as plasma processing tools already have a high cost without this additional complexity. Further, companies involved in the manufacturing of integrated circuits work to limit their overhead including cost of ownership of each piece of equipment within their manufacturing line. Current solutions do not provide simple, low cost solutions for plasma discharge stability detection.

SUMMARY

Embodiments are described herein that provide plasma source operating stability control and process tool matching for use in integrated circuit fabrication of microelectronic workpieces. The disclosed embodiments provide an image capture technique to determine plasma light intensity with automatic or manual spectra analysis. This light intensity data is used to adjust parameters for the plasma sources and/or for process chambers. For example, stability of plasma discharge operations and chamber-to-chamber matching information can be determined in various process tools such as plasma etch or deposition tools, and this information can be used to adjust operating parameters for the plasma sources and/or the process chambers. Different or additional features, variations, and embodiments can also be implemented, and related systems and methods can be utilized as well.

For one embodiment, a method for the manufacture of microelectronic workpieces is disclosed including providing an image sensor in a process chamber, performing a process recipe within the process chamber while a plasma is generated by a plasma source, capturing images with the image sensor during the performing where the images are associated with the plasma source, and adjusting one or more operating parameters for the process chamber based upon light intensity distributions determined from the captured images.

In additional embodiments, the determining includes processing the captured images to analyze light intensity distributions within a predetermined spectral range. In further embodiments, the process recipe includes a selected set of ranges for parameters. In still further embodiments, the selected set of ranges for parameters are associated with one or more test conditions.

In additional embodiments, the method also includes repeating the providing, performing, capturing, and adjusting for a plurality of process chambers. In further embodiments, the method includes determining stability margins based upon light intensity distributions determined from captured images for the plurality of process chambers. In still further embodiments, the adjusting is based upon the stability margins. In further embodiments, the method includes determining chamber-to-chamber matching information based upon the light intensity distributions determined from captured images for the plurality of process chambers. In still further embodiments, the adjusting is based upon the chamber-to-chamber matching information. In further embodiments, the image sensor is coupled to a substrate for a microelectronic workpiece positioned within the plurality of process chambers.

In additional embodiments, the process recipe includes a plasma etch process. In further embodiments, the process recipe includes a plasma deposition process. In further embodiments, the image sensor includes a charge-coupled device camera. In further embodiments, the image sensor is coupled to a substrate positioned within the process chamber. In further embodiments, the image sensor is positioned on a hardware component within the process chamber.

In additional embodiments, the capturing includes capturing and storing image data using the image sensor. In further embodiments, the method also includes communicating the image data to a computing system. In still further embodiments, the communicating occurs through at least one wireless interface.

In additional embodiments, the one or more operating parameters for the process chamber include at least one of a process gas flow rate, a pressure, a temperature, or a source power. In further embodiments, the method also includes emitting light into the process chamber and inspecting hardware components within the process chamber using the image sensor.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

As described herein, methods are disclosed to detect plasma light emissions, to analyze light intensity data associated with a plasma source, and to adjust operating parameters for the plasma source based upon the light intensity distributions. The light intensity distributions for the plasma sources and related analysis can be conducted across multiple processing tools. For some embodiments, plasma discharge stability and/or chamber-to-chamber matching information is determined based upon light intensity data, and the operation of the processing tools are adjusted or controlled based upon stability and/or matching determinations. The disclosed embodiments thereby provide simple, low-cost solutions to improve plasma sources and discharge stability for plasma processing tools such as plasma etch and deposition tools. Other advantages and implementations can also be achieved while still taking advantage of the process techniques described herein.

As described above, HW variations and other factors lead to plasma discharge instability and abnormal plasma discharge for plasma processing tools such as plasma etch tools and/or plasma deposition tools. Further, some plasma discharge instability and/or abnormal discharge is not detectable from conventional process logs. As such, process engineers may develop unreliable process recipes for high volume production without being aware of the abnormality.

The disclosed embodiments provide simple, low-cost solutions for plasma instability detection in plasma processing tools. The disclosed embodiments are easy to use and can provide a definitive answer to how plasma light intensity distribution varies across the plasma source for a plasma processing tool. In particular, methods and related systems are disclosed to use an image sensor, such as a charge-coupled device (CCD) camera, to detect light intensity distributions. For example, the image sensor can be attached to a substrate for a microelectronic workpiece that is moved in and out of a plasma processing tool and that captures images during the plasma processing with the plasma processing tool. The captured images (e.g., still and/or video images) can then be analyzed for variation in light intensity across the plasma source. This light intensity distribution information can then be used to diagnose process sensitivities and to modify process parameters or conditions to limit any marginality observed for non-optimized process conditions. Multiple plasma processing tools can be tested in a similar manner. The results can be used to improve chamber-to-chamber matching and process control thereby providing for improved operating stability for the manufacturing processes.

Figure 2A:
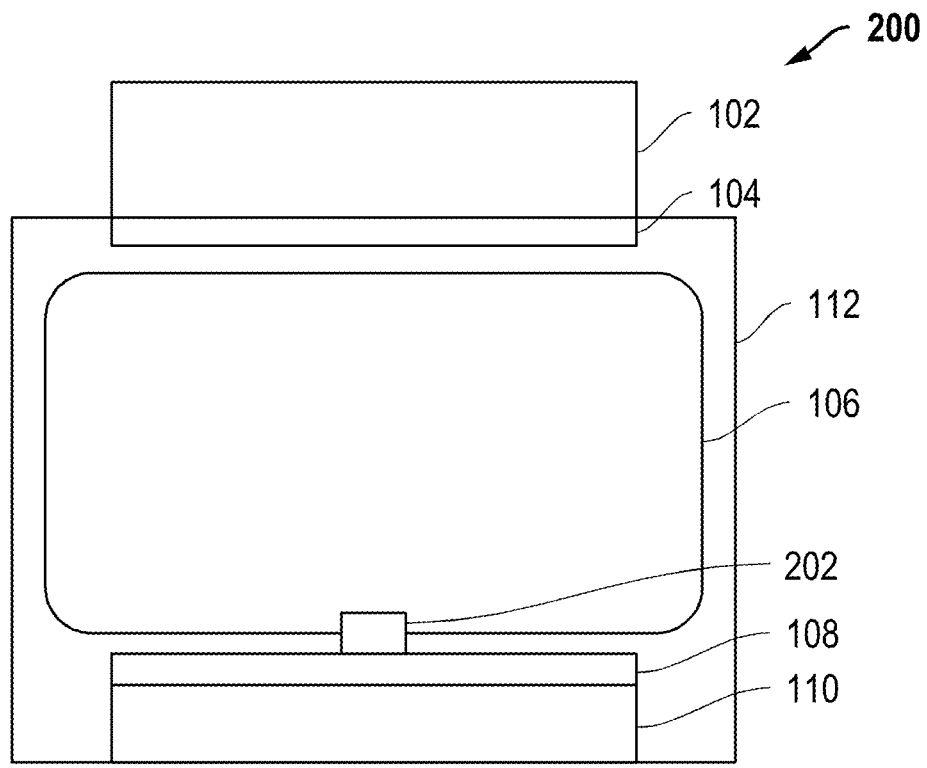
FIG. 2A is a diagram of an example embodiment for a plasma processing tool according to the disclosed inventions where an image sensor is positioned within the process chamber to capture images associated with a plasma source.

FIG. 2A is a diagram of an example embodiment for a plasma processing tool 200 according to the disclosed inventions where an image sensor 202 is included on a substrate for a microelectronic workpiece 108 within the process chamber 112. The microelectronic workpiece 108 with the image sensor 202 is positioned on a holder 110 including a lower electrode. The holder 110 can be, for example, a wafer station, an electrostatic chuck, and/or another holder for a microelectronic workpiece within the process chamber 112. A plasma source 102 can also be provided as part of the plasma processing tool 200, and the plasma source can have a top plate 104. For plasma processing, such as plasma etch or deposition processing, process plasma 106 is ignited and maintained within the process chamber 112 for the plasma processing tool 200.

During plasma processing, the image sensor 202 captures images, such as still images and/or video images. For example, images of the top plate 104 for the plasma source 102 can be captured by the image sensor 202. While the image sensor 202 is shown as coupled to a substrate for a microelectronic workpiece 108, it is further noted that the image sensor 202 can also be positioned within the process chamber 112 using one or more other techniques. For example, the image sensor 202 can be coupled directly to the holder 110, can be positioned on another hardware component below the plasma source 102, and/or can be otherwise positioned within the process chamber 112 to capture images of the plasma source 102 during plasma generation within the process chamber 112.

As described herein, the images captured by the image sensor 202 are analyzed to determine adjustments for one or more parameters for the plasma processing, such as to improve plasma discharge stability. For example, light intensity distributions within these images in particular areas of the plasma source 102 can be recognized by a imaging processing algorithms implemented with one or more processors executing software instructions stored in a non-transitory computer readable medium. For example, the analysis of captured images can identify and monitor light intensity in a predetermined spectral range (e.g., range of wavelengths). For one embodiment, light intensity having wavelengths in a range from 200 nanometers (nm) to 800 nm can be identified and monitored. Further, light intensity distribution within these images can also be determined from visual inspection by an operator. In addition, images can be captured and light intensity distributions can be determined for a number of different process chambers 112. Processing parameters can then be adjusted for the plasma source 102 and/or the process chamber 112 based upon the captured images to improve the plasma processing and/or to reduce chamber-to-chamber variations for plasma processing using multiple chambers.

Using captured images and light intensity distributions, desired ranges of processing parameters can also be tested and modified to achieve target plasma discharge stability. These processing parameters include, for example, process gas flow rates, pressure, temperature, source power, and/or other process parameters. For one further example, the capture images and/or light intensity distributions can be used to determine the minimum MW (microwave) source power for stable operation of radial line slot antenna (RLSA™) system.

It is further noted that the image sensor 202, such as a CCD camera, can also be used for visual checking of hardware components and/or parts within the process chamber and their condition. For example, light can be emitted within the process chamber (e.g., light from a flash light), and captured images can be collected without igniting plasma within the process chamber 112. These images can then be used to determine the condition of HW components within the process chamber 112.

Figure 2B:
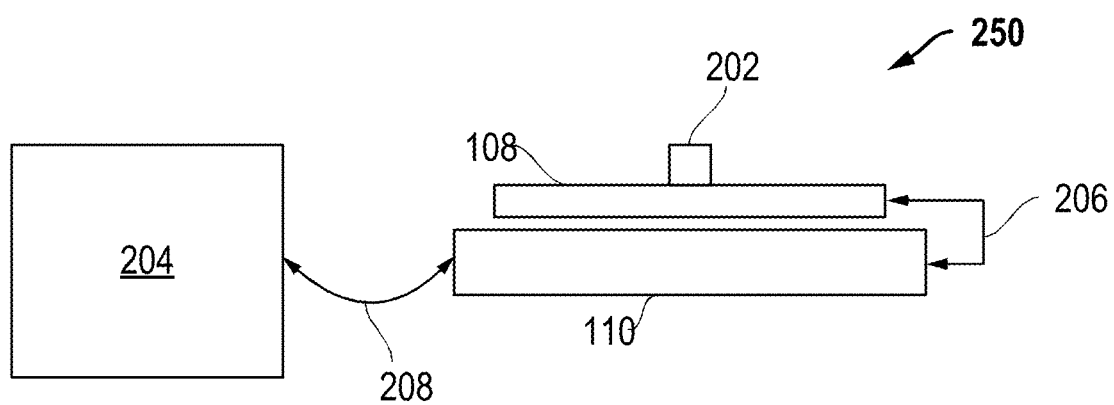
FIG. 2B is a diagram of an example embodiment for a computing environment for the disclosed embodiments.

FIG. 2B is a diagram of an example embodiment for a computing environment 250 for the disclosed embodiments. For this embodiment, the holder 110 for the substrate for the microelectronic workpiece 108 (e.g., semiconductor wafer) includes a wireless communication interface and connectivity with the substrate. The substrate for the microelectronic workpiece 108 also includes a wireless communication interface and connectivity to the holder 110. As such, wireless communications 206 are provided between the substrate for the microelectronic workpiece 108 and the holder 110. Setup parameters, measurements, file transfer, captured image data, and/or other desired communications can be performed using these wireless communications 206.

Further, the holder 110 can be wired or wirelessly connected to a computing system 204, such as personal computer (PC), to provide communications 208 between the holder 110 and the computing system 204. The computing system 204 operates to receive and analyze the captured image data from the image sensor 202. Preferably, the computing system 204 is positioned outside the process chamber 112, while the holder 110 and the microelectronic workpiece 108 are positioned inside the process chamber 112. It is further noted that the computing system 204 can be implemented using one or more programmable integrated circuits that are programmed to provide the functionality described herein. For example, one or more processors (e.g., microprocessor, microcontroller, central processing unit, etc.), programmable logic devices (e.g., CPLD (complex programmable logic device), FPGA (field programmable gate array), etc.), and/or other programmable integrated circuits can be programmed with software or other program instructions to implement the functionality described herein. It is further noted that the software or other program instructions can be stored in one or more non-transitory computer-readable data storage mediums (e.g., memory storage devices, FLASH memory, DRAM memory, reprogrammable storage devices, hard drives, floppy disks, DVDs, CD-ROMs, etc.), and the software or other program instructions when executed by the programmable integrated circuits cause the programmable integrated circuits to perform the processes, functions, and/or capabilities described herein. Other variations could also be implemented.

Figure 1A:
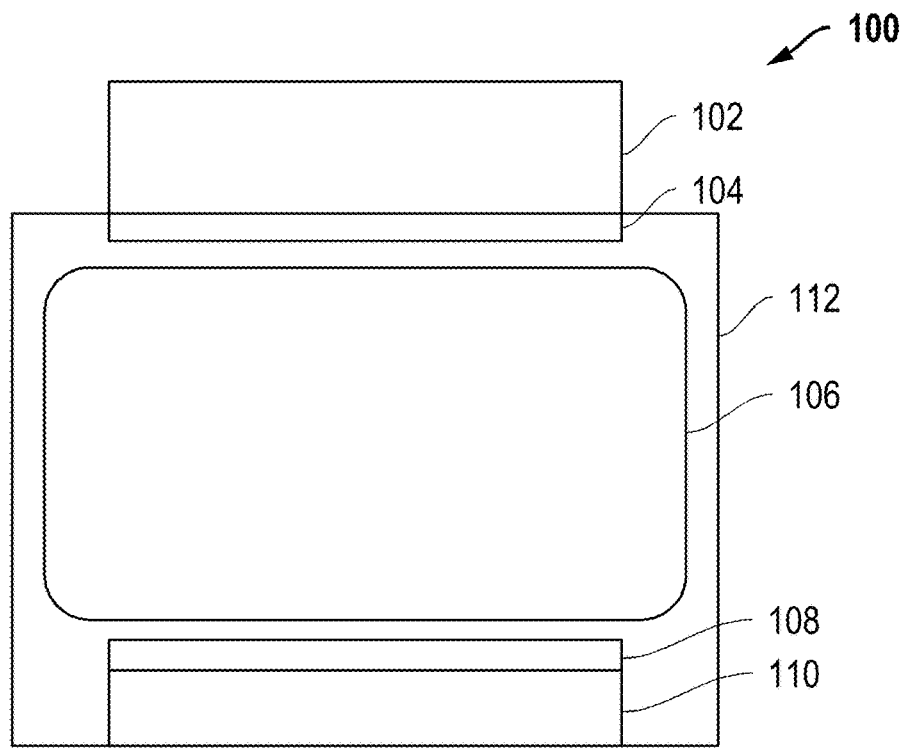
FIG. 1A (Prior Art) is a diagram of an example embodiment for a plasma processing tool including a process chamber and a plasma source positioned within the process chamber.
Figure 1B:
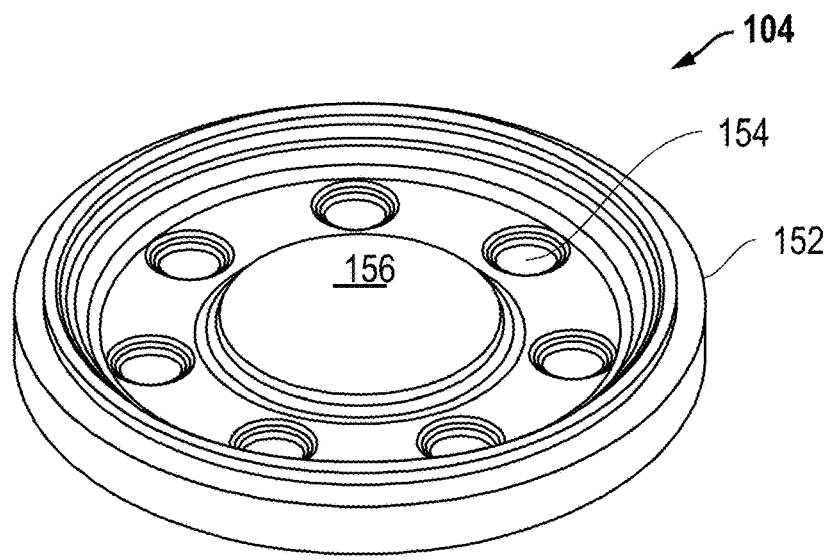
FIG. 1B (Prior Art) is a diagram of an example embodiment for a top plate for the plasma source.
Figure 2C:
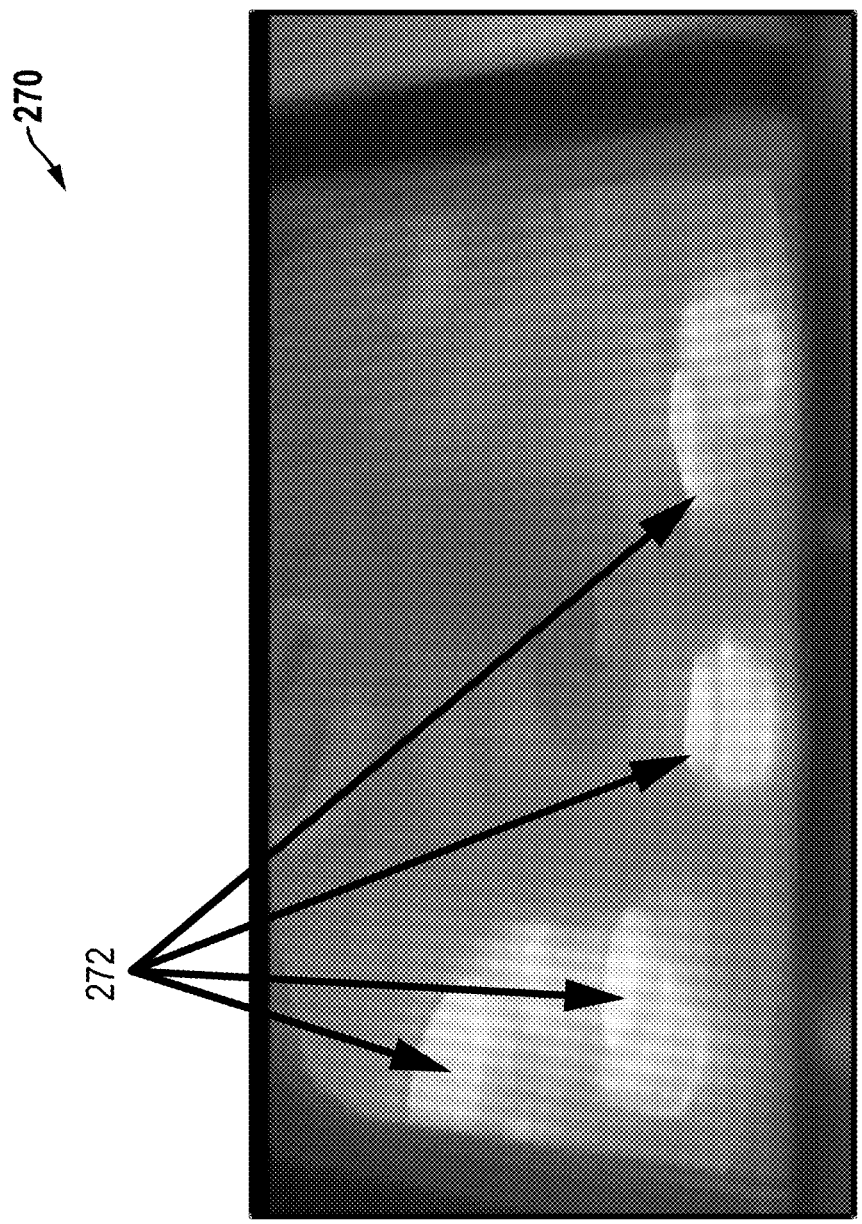
FIG. 2C is a representative image capture of an example embodiment for plasma discharge generated during an example plasma process with respect to dimples of a top plate for a plasma source.

FIG. 2C is a representative image capture of an example embodiment 270 for plasma discharge generated during an example plasma process with respect to dimples 154 of a top plate 104 for a plasma source 102, such as shown in FIG. 1B (Prior Art). Preferably, plasma discharge would be lit in all dimples 154. However, as seen for an example process (e.g., applied power of 700 watts), only four of the seven dimples 154 have increased light intensity 272 representing plasma discharge ignition. The other three of the seven dimples 154 have no plasma discharge.

Without the light intensity measurements provided by the embodiments disclosed herein, this plasma discharge instability may remain undetected by processing engineers. For example, it has been found that process logs for an example process at 700 watts may show plasma discharge stability even though instability is in fact occurring as shown in FIG. 2C. Further, it has been found that these process logs can be similar to process logs for a plasma process at 1700 watts where all dimples 154 for a top plate 104 had plasma discharge. As described above, prior solutions are not able to provide detection of plasma discharge instability without significant added complexity and cost.

It is further noted that a variety of adjustments to operating parameters for the plasma source 102 and/or the process chamber 112 can be made based upon the images captured by the image sensor 202. For example, if the captured images show that plasma discharge is not occurring evenly across the plasma source 102, such as shown in FIG. 2C, operating parameters can be adjusted until plasma discharge ignition is achieved evenly across the plasma source 102. If the captured images show that the intensity of plasma discharge is not evenly distributed across the plasma source 102, operating parameters can be adjusted until plasma discharge uniformity is achieved. It is further noted that the captured images can be analyzed based upon the relative absorption of light energy by the image sensor 202 across the image. Other variations and adjustments could also be made while still taking advantage of the image capture and analysis techniques described herein to improve plasma processing.

Figure 3A:
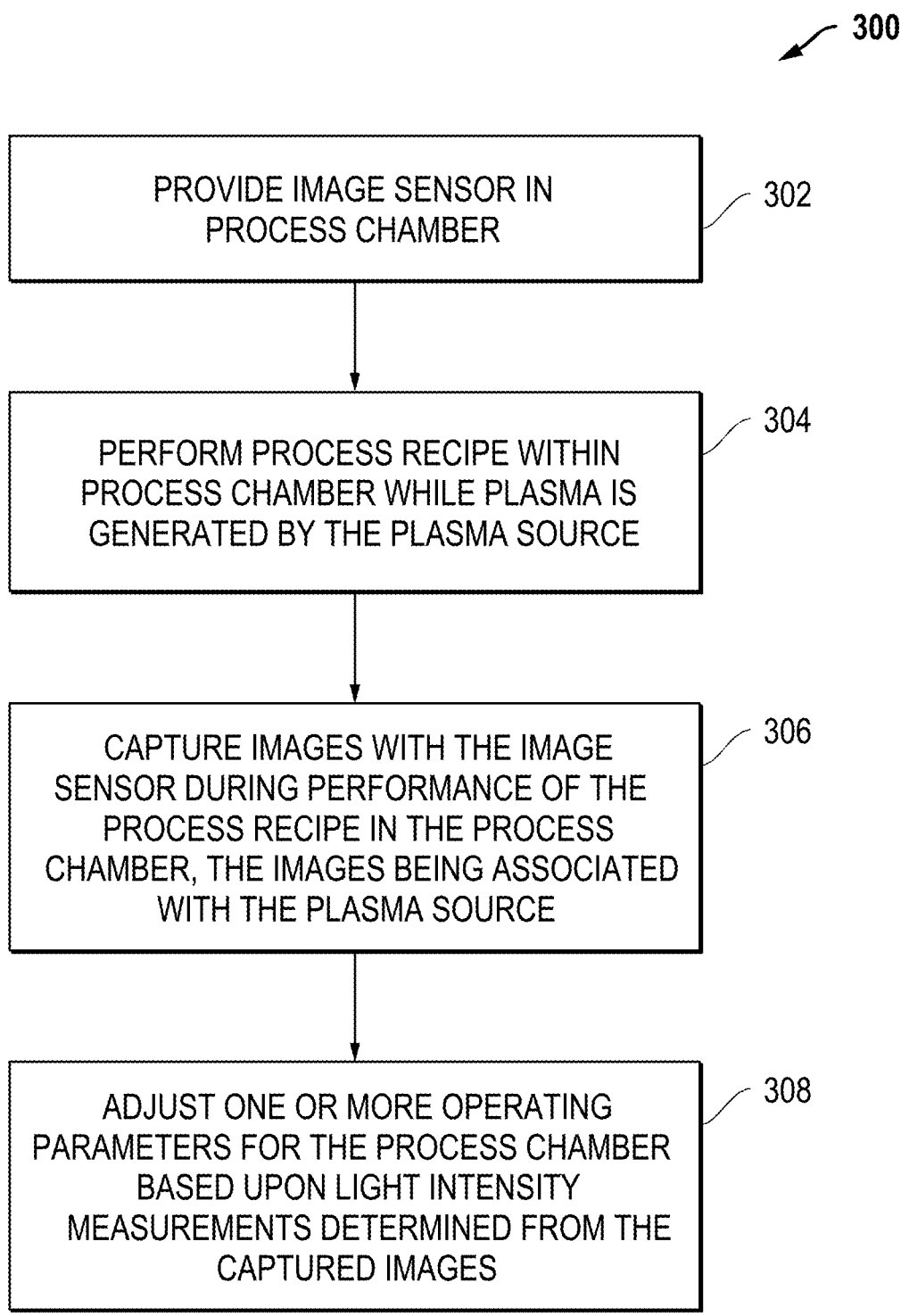
FIG. 3A is a process flow diagram of an example embodiment where images captured by an image sensor are used to adjust operating parameters for a process chamber for manufacture of microelectronic workpieces.

FIG. 3A is a process flow diagram of an example embodiment 300 where images captured by an image sensor are used to adjust operating parameters for a process chamber for manufacture of microelectronic workpieces. In block 302, an image sensor is provided within the process chamber. In block 304, a process recipe is performed within the process chamber while a plasma is generated by a plasma source. In block 306, images are captured with the image sensor during the performing, and the images are associated with the plasma source. In block 308, one or more operating parameters are adjusted for the process chamber based upon light intensity distributions determined from the captured images. For example, light intensity distribution analysis can be conducted through automatic computational analysis of the images by one or more processors. Further, light intensity distribution analysis can be conducted by manual analysis of the images by the tool operator. Different and/or additional process steps could also be used while still taking advantage of the embodiment described herein.

Figure 3B:
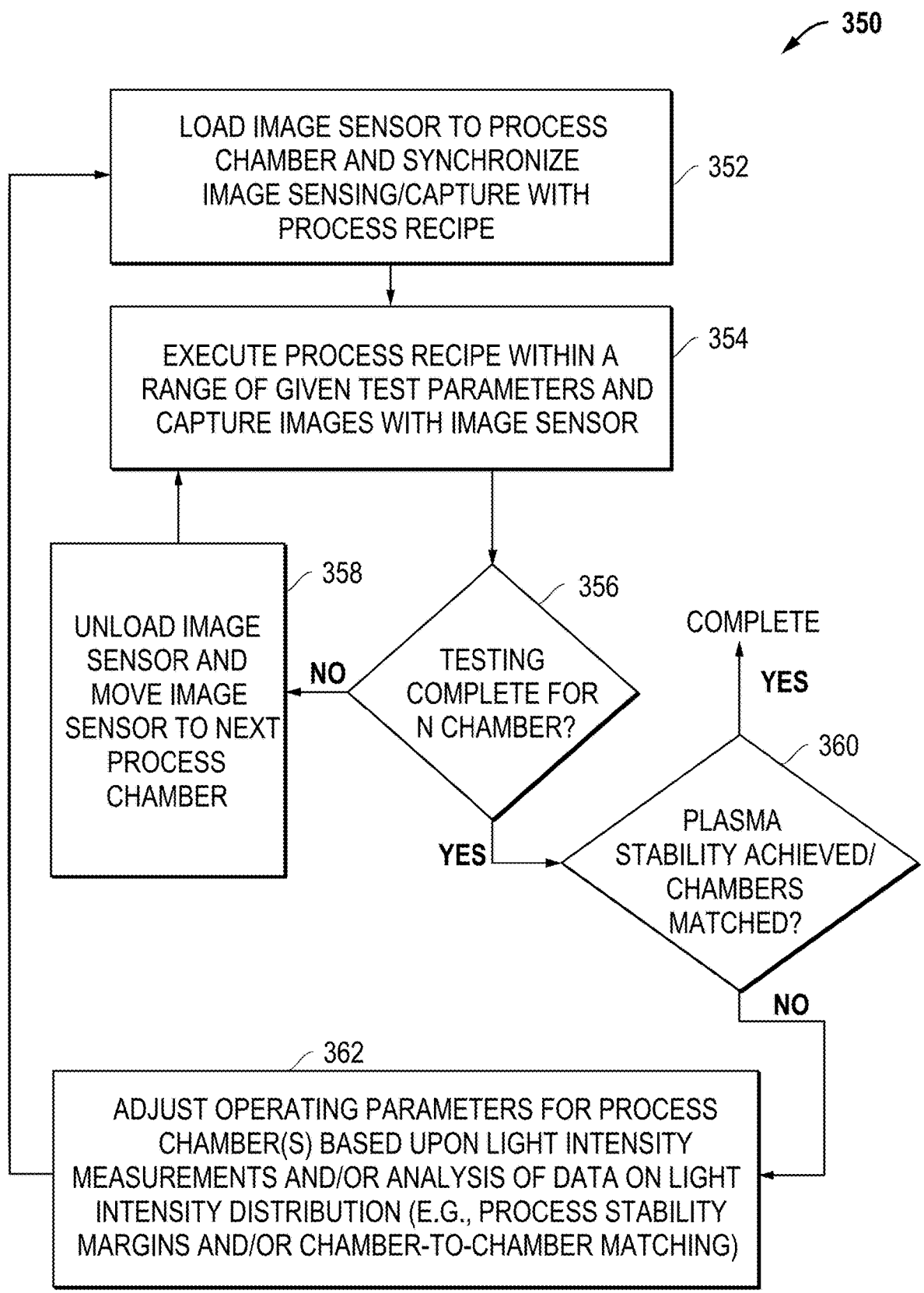
FIG. 3B is a process flow diagram of an example embodiment where image sensing and related image analysis for a number of different process chambers are used to improve plasma sources and plasma processing of microelectronic workpieces.

FIG. 3B is a process flow diagram of an example embodiment 350 where image sensing and related image analysis for a number of different process chambers are used to improve plasma sources and plasma processing of microelectronic workpieces. In block 352, an image sensor is loaded into a process chamber, and the image sensing/capture is synchronized with a process recipe. In block 354, the process recipe is executed within a range of given test parameters, and image data is captured by the image sensor. The image data captured during the test can also be uploaded or otherwise transferred to a computing system, or the image data can be stored in one or more data storage mediums for later transfer after testing is complete for the N different process chambers. In block 356, a determination is made whether testing is complete for N different chambers where N is greater than one. If "NO," then flow passes to block 358 where the image sensor is unloaded from a module or process chamber and moved or loaded into a next process chamber. Flow then passes back to block 354. If the determination is "YES" in block 356, then flow passes to block 360 where a determination is made whether plasma stability and/or chamber matching has been achieved. If the determination is "YES" in block 360, then the processing is complete. If the determination is "NO" in block 360, then block 362 is reached. In block 362, manual or automatic analysis is then performed on data for light intensity distribution represented by the captured image data. Adjustments can then be made to operating parameters for one or more of the N process chambers based upon the light intensity distribution to improve the plasma processing. These adjustments can include adjustments to the plasma source. For example, decisions and determinations can be made on process stability margins and/or chamber-to-chamber matching using light intensity distribution determined from the captured image data. Other chamber adjustments and/or plasma processing control adjustments can also be made based upon the captured image data. Once the adjustments have been completed in block 362, flow then passes back to block 352. It is further noted that different and/or additional process steps could also be used for embodiment 350 while still taking advantage of the techniques described herein.

For certain embodiments, a plasma view system is provided to facilitate the visualization of the plasma data collection and analysis for plasma applications. The plasma view system can be part of the computing system 204 shown in FIG. 2B. The plasma view system in effect puts the user inside the process zone for detailed plasma etch and/or deposition process analysis. In addition to visualizing light intensity distributions within the process chamber, the plasma view system can also link plasma data measurements from temperature, voltage, image capture, and/or other in-chamber sensors. This uplinked plasma data can also be displayed versus time and space (2D or 3D). Movie views can also be displayed to provide a feel for the critical transient responses and are useful for fault investigation.

The plasma data analysis including the image data analysis allows plasma etch processes to be better controlled. Plasma etch processes are notoriously difficult to control. The sheer complexity of plasma etch systems and the number of plasma etch process variables makes plasma etch a constant focus for process control and improvement efforts within a fabrication facility. The plasma image capture provides a new level of plasma process control that helps the monitoring and control of day-to-day operations as well as chamber-to-chamber matching. This improved plasma control distills the complicated plasma etch/deposition process down to a few critical control features and compares plasma data analysis to user specifications for control. The user can then be provided an indication that a process is "good" or "not good" for each run with the ability to view trends, detect and investigate excursions, and compare chambers.

The plasma data collection and analysis system described herein gets inside the black box of plasma etch processes to help engineers identify the most likely cause of chamber problems. Despite advances in production techniques, plasma etch/deposition process and equipment engineers still rely on their experience and trial and error methods to diagnose chamber issues, which can be a timely, costly and often frustrating experience. With the plasma data collection and analysis system described herein, plasma etch process engineers can utilize their sensor wafers to effectively diagnose the root cause of a digression within minutes, all without opening the chamber or requiring offline metrology.

The image sensor based methods and systems described herein can be used to detect many kinds of issues of plasma process equipment such as non-uniformity, abnormal discharge, ignition failure, and/or other plasma processing issues. The disclosed methods and systems can also calculate reliability scores of a plasma process based on trace data and classifiers defined or selected by users. Further, the disclosed systems help process engineers to develop reliable process recipes and to troubleshoot problems in production more efficiently.

Figure 4:
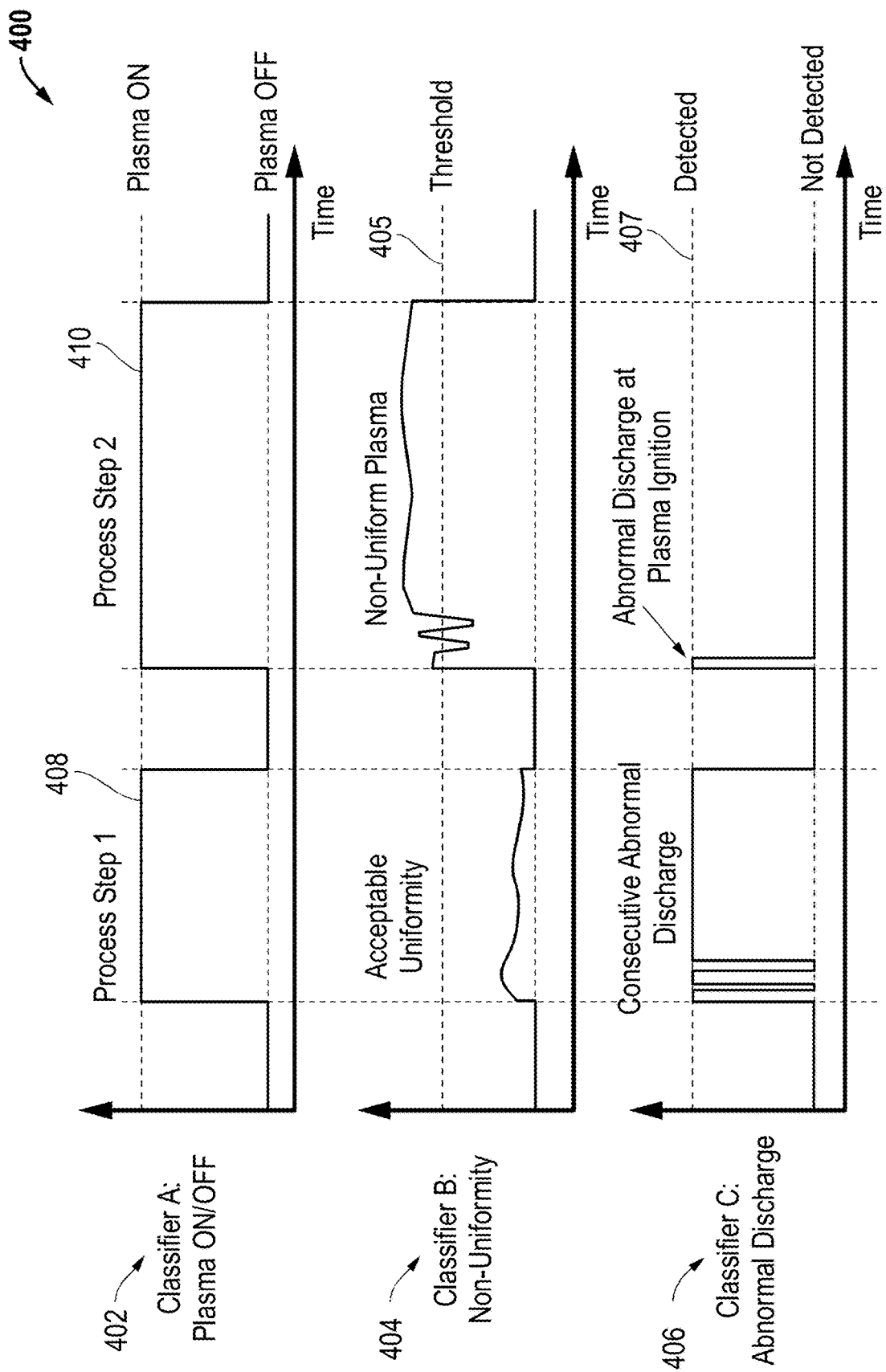
FIG. 4 is a diagram of an embodiment for plasma process stability determinations based upon detection thresholds associated with different classifiers.

FIG. 4 is a diagram of an embodiment 400 for plasma process stability determinations based upon detection thresholds associated with different classifiers. Time-based diagram 402 provides a first classifier (CLASSIFIER A) indicating whether plasma is ON or OFF. For the example depicted, plasma is ON during a first process step 408, and plasma is also ON during a second process step 410. Otherwise, plasma is OFF. Time-based diagram 404 provides a second classifier (CLASSIFIER B) indicating whether plasma light emission uniformity is above or below a desired threshold 405. For the embodiment depicted, acceptable plasma light emissions uniformity is achieved during the first process step 408, and non-uniform light emission is detected during the second process step 410. Time-based diagram 406 provides a third classifier (CLASSIFIER C) indicating whether plasma discharge is abnormal. For the embodiment depicted, consecutive abnormal plasma discharge is detected during the first process step 408, and abnormal discharge at plasma ignition is detected during the second process step 410. These time-based diagrams can be presented to a process engineer and allow the engineer to adjust and control plasma processing operations with better visibility into the actual results being achieved by the plasma processing. Other variations and thresholds could also be detected and managed while still taking advantage of the techniques described herein.

It is noted that one or more deposition processes can be used to form the material layers described herein. For example, one or more depositions can be implemented using chemical vapor deposition (CVD), plasma enhanced CVD (PECVD), physical vapor deposition (PVD), atomic layer deposition (ALD), and/or other deposition processes. For a plasma deposition process, a precursor gas mixture can be used including but not limited to hydrocarbons, fluorocarbons, or nitrogen containing hydrocarbons in combination with one or more dilution gases (e.g., argon, nitrogen, etc.) at a variety of pressure, power, flow and temperature conditions. Lithography processes with respect to PR layers can be implemented using optical lithography, extreme ultraviolet (EUV) lithography, and/or other lithography processes. The etch processes can be implemented using plasma etch processes, discharge etch processes, and/or other desired etch processes. For example, plasma etch processes can be implemented using plasma containing fluorocarbons, oxygen, nitrogen, hydrogen, argon, and/or other gases. In addition, operating variables for process steps can be controlled to ensure that CD (critical dimension) target parameters for vias are achieved during via formation. The operating variables may include, for example, the chamber temperature, chamber pressure, flowrates of gases, frequency and/or power applied to electrode assembly in the generation of plasma, and/or other operating variables for the processing steps. Variations can also be implemented while still taking advantage of the techniques described herein.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic workpiece" as used herein generically refers to the object being processed in accordance with the invention. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a microelectronic workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method for the manufacture of microelectronic workpieces, comprising:
   providing an image sensor in a process chamber;
   performing a process recipe within the process chamber while a plasma is generated by a plasma source;
   capturing images with the image sensor during the performing, the images being associated with the plasma source; and
   adjusting one or more operating parameters for the process chamber based upon light intensity distributions determined from the captured images.

2. The method of claim 1, wherein the determining comprises processing the captured images to analyze light intensity distributions within a predetermined spectral range.

3. The method of claim 1, wherein the process recipe includes a selected set of ranges for parameters.

4. The method of claim 3, wherein the selected set of ranges for parameters are associated with one or more test conditions.

5. The method of claim 1, further comprising repeating the providing, performing, capturing, and adjusting for a plurality of process chambers.

6. The method of claim 5, further comprising determining stability margins based upon light intensity distributions determined from captured images for the plurality of process chambers.

7. The method of claim 6, wherein the adjusting is based upon the stability margins.

8. The method of claim 5, further comprising determining chamber-to-chamber matching information based upon the light intensity distributions determined from captured images for the plurality of process chambers.

9. The method of claim 8, wherein the adjusting is based upon the chamber-to-chamber matching information.

10. The method of claim 5, wherein the image sensor is coupled to a substrate for a microelectronic workpiece positioned within the plurality of process chambers.

11. The method of claim 1, wherein the process recipe includes a plasma etch process.

12. The method of claim 1, wherein the process recipe includes a plasma deposition process.

13. The method of claim 1, wherein the image sensor comprises a charge-coupled device camera.

14. The method of claim 1, wherein the image sensor is coupled to a substrate positioned within the process chamber.

15. The method of claim 1, wherein the image sensor is positioned on a hardware component within the process chamber.

16. The method of claim 1, wherein the capturing comprises capturing and storing image data using the image sensor.

17. The method of claim 16, further comprising communicating the image data to a computing system.

18. The method of claim 17, wherein the communicating occurs through at least one wireless interface.

19. The method of claim 1, wherein the one or more operating parameters for the process chamber comprise at least one of a process gas flow rate, a pressure, a temperature, or a source power.

20. The method of claim 1, further comprising emitting light into the process chamber and inspecting hardware components within the process chamber using the image sensor.

* * * * *